United States Patent [19]

Subramanian

[11] Patent Number: 5,036,043
[45] Date of Patent: Jul. 30, 1991

[54] PROCESS FOR MAKING 90 K SUPERCONDUCTORS

[75] Inventor: Munirpallam A. Subramanian, New Castle, Del.

[73] Assignee: E. I. Du Pont de Nemours and Company, Wilmington, Del.

[21] Appl. No.: 529,752

[22] Filed: May 24, 1990

Related U.S. Application Data

[63] Continuation of Ser. No. 76,686, Jul. 22, 1987, abandoned, which is a continuation-in-part of Ser. No. 51,860, May 19, 1987, abandoned.

[51] Int. Cl.$^5$ .............................................. H01L 39/12
[52] U.S. Cl. .......................................... 505/1; 264/65; 252/521; 505/739; 505/780
[58] Field of Search ...................... 264/65; 505/1, 780, 505/739; 252/521; 501/152

[56] References Cited

U.S. PATENT DOCUMENTS 4,766,010   8/1988   Takeuchi et al. ..................... 264/61

OTHER PUBLICATIONS

Politis et al., "Superconductivity "at 40 in Laie Sto.z C$_4$O$_4$ Condensed Matter, Spring 1987, vol. 66, pp. 141–146.
Hor et al., Physical Review Letters, vol. 58, No. 18, pp. 1891–1894, 4 May 1987.
Tarascon et al., Physical Review B, vol. 36, No. 1, pp. 226–234, 1987.
Navek et al., Mat. Res. Bull., vol. 24, pp. 283–287, 1989.
Z. Phys. B64, 189–193 (1986), Bednorz et al.
Phys. Rev. Lett. 58, 405–407 (1987), Chu et al.
Science 235, 567–569 (1987), Chu et al.
Phys. Rev. Lett. 58, 408–410 (1987), Cava et al.
Current Science 56, 47–49 (1987), Rao et al.
Europhys. Lett. 3, 379–384 (1987), Bednorz et al.
Phys. Rev.Lett. 58, 908–910 (1987), Wu et al.
Phys. Rev. Lett. 58, 405–407 (1987), Chu et al.
Phys. Rev. Lett. 58, 911–912 (1987), Hor et al.
J.C.S. Dalton 1061–1066 (1975), Arjomand et al.
Phys. Rev. Lett. 58, 1574–1576 (1987), Sun et al.
Phys. Rev. Lett. 58, 1676–1679 (1987), Cava et al.
Hepp et al., "Inert Atmosphere Preparation of Ba$_2$YCu$_3$O$_{7-x}$ Using BaO$_2$", Mat. Res. Bull., vol. 23, pp. 697–700 (1988).
Brinker et al., Eds., "Better Ceramics Through Chemistry III" Materials Research Society Symposium Proceedings, vol. 121, pp. 385–389 (1988).

*Primary Examiner*—James Derrington

[57] ABSTRACT

There is disclosed an improved process for preparing a superconducting composition having the formula $MBa_2Cu_3O_x$ wherein M is selected from the group consisting of Y, Nd, Sm, Eu, Gd, Dy, Ho, Er, Tm, Yb and Lu; x is from about 6.5 to about 7.0; said composition having a superconducting transition essentially of mixing $M_2O_3$, $BaO_2$ and CuO in an atomic ratio of M:Ba:Cu of about 1:2:3 to obtain a powder mixture; heating the resulting mixture in an oxygen-containing atmosphere at a temperature from about 850° C. to about 925° C. for a time sufficient to form $MBa_2Cu_3O_y$, where y is from about 6.0 to about 6.4; and maintaining the $MBa_2Cu_3O_y$ in an oxygen-containing atmosphere while cooling for a time sufficient to obtain the desired product.

18 Claims, No Drawings

PROCESS FOR MAKING 90 K SUPERCONDUCTORS

CROSS-REFERENCE TO RELATED APPLICATIONS

This application is a continuation of application Ser. No. 07/076,686 filed July 22, 1987 now abandoned which is a continuation-in-part of copending patent application Ser. No. 051,860, filed on May 9, 1987.

BACKGROUND OF THE INVENTION

1. Field of the Invention

This invention relates to an improved process for making rare earth-barium-copper oxide superconductors with transition temperatures above 90 K.

2. Description of Related Art

Bednorz and Muller, *Z. Phys.* B64, 189-193 (1986), disclose a superconducting phase in the La-Ba-Cu-O system with a superconducting transition temperature of about 35 K. Samples were prepared by a coprecipitation method from aqueous solutions of Ba-, La- and Cu-nitrate in their appropriate ratios. An aqueous solution of oxalic acid was used as the precipitant.

Chu et al., *Phys. Rev. Lett.* 58, 405-407 (1987), report detection of an apparent superconducting transition with an onset temperature above 40 K under pressure in the La-Ba-Cu-O compound system synthesized directly from a solid-state reaction of $La_2O_3$, CuO and $BaCO_3$ followed by a decomposition of the mixture in a reduced atmosphere. Chu et al., *Science* 235, 567-569 (1987), disclose that a superconducting transition with an onset temperature of 52.5 K has been observed under hydrostatic pressure in compounds with nominal compositions given by $(La_{0.9}Ba_{0.1})_2CuO_{4-y}$, where y is undetermined. They state that the $K_2NiF_4$ layer structure has been proposed to be responsible for the high-temperature superconductivity in the La-Ba-Cu-O system (LBCO). They further state that, however, the small diamagnetic signal, in contrast to the presence of up to 100% $K_2NiF_4$ phase in their samples, raises a question about the exact location of superconductivity in LBCO.

Cava et al., *Phys. Rev. Lett.* 58, 408-410 (1987), disclose bulk superconductivity at 36 K in $La_{1.8}Sr_{0.2}CuO_4$ prepared from appropriate mixtures of high purity La-$(OH)_3$, $SrCO_3$ and CuO powders, heated for several days in air at 1000° C. in quartz crucibles. Rao et al., *Current Science* 56, 47-49 (1987), discuss superconducting properties of compositions which include $La_{1.8}Sr_{0.2}CuO_4$, $La_{1.85}Ba_{0.15}CuO_4$, $La_{1.8}Sr_{0.1}CuO_4$, $(La_{1-x}Pr_x)_{2-y}Sr_yCuO_4$, and $(La_{1.75}Eu_{0.25})Sr_{0.2}CuO_4$. Bednorz et al., *Europhys. Lett.* 3, 379-384 (1987), report that susceptibility measurements support high-$T_c$ superconductivity in the Ba-La-Cu-O system. In general, in the La-Ba-Cu-O system, the superconducting phase has been identified as the composition $La_{1-x}(Ba,Sr,Ca)_xCuO_{4-y}$ with the tetragonal $K_2NiF_4$-type structure and with x typically about 0.15 and y indicating oxygen vacancies.

Wu et al., *Phys. Rev. Lett.* 58, 908-910 (1987), disclose a superconducting phase in the Y-Ba-Cu-O system with a superconducting transition temperature between 80 and 93 K. The compounds investigated were prepared with nominal composition $(Y_{1-x}Ba_x)_2CuO_{4-y}$ and x=0.4 by a solid-state reaction of appropriate amounts of $Y_2O_3$, $BaCO_3$ and CuO in a manner similar to that described in Chu et al., *Phys. Rev. Lett.* 58, 405-407 (1987). Said reaction method comprises more specifically heating the oxides in a reduced oxygen atmosphere of $2 \times 10^{-5}$ bars (2 Pa) at 900° C. for 6 hours. The reacted mixture was pulverized and the heating step was repeated. The thoroughly reacted mixture was then pressed into 3/16 inch (0.5 cm) diameter cylinders for final sintering at 925° C. for 24 hours in the same reduced oxygen atmosphere. The material prepared showed the existence of multiple phases.

Hor et al., *Phys. Rev. Lett.* 58, 911-912 (1987), disclose that pressure has only a slight effect on the superconducting transition temperature of the Y-Ba-Cu-O superconductors described by Wu et al., supra.

Arjomand et al., *J. C. S. Dalton* 1061-1066 (1975), disclose the preparation of $BaCuO_{2.5}$ by heating an equimolar mixture of $BaO_2$ and $Cu(NO_3)$ at 580° C. for 24 hours.

SUMMARY OF THE INVENTION

This invention provides an improved process for preparing superconducting compositions having the formula $MBa_2Cu_3O_x$ wherein M is selected from the group consisting of Y, Nd, Sm, Eu, Gd, Dy, Ho, Er, Tm, Yb and Lu; x is from about 6.5 to about 7.0; said composition having a superconducting transition temperature of about 90 K; said process consisting essentially of mixing $M_2O_3$, $BaO_2$ and CuO in an atomic ratio of M:Ba:Cu of about 1:2:3 to obtain a powder mixture; heating the resulting mixture in an oxygen-containing atmosphere at a temperature of from about 850° C. to about 925° C. for a time sufficient to form $MBa_2Cu_3O_y$, where y is from about 6.0 to about 6.4; and maintaining the $MBa_2Cu_3O_y$ in an oxygen-containing atmosphere while cooling for a time sufficient to obtain the desired product. The powder mixture can be pressed into a desired shape prior to heating. The invention also provides the shaped article prepared by the process of the invention.

DETAILED DESCRIPTION OF THE INVENTION

The process of the invention provides an improved process for preparing superconducting compositions having the formula $MBa_2Cu_3O_x$. M is selected from the group consisting of Y, Nd, Sm, Eu, Gd, Dy, Ho, Er, Tm, Yb and Lu, but is preferably Y, Eu or Er, and is most preferably Y. The parameter x is from about 6.5 to about 7.0, but is preferably from about 6.8 to about 7.0. In the process of the invention, the use of $BaO_2$ as the source of Ba results in the preparation of a uniform single-phase superconducting $MBa_2Cu_3O_x$ composition.

The process of the invention consists essentially of mixing $M_2O_3$, $BaO_2$ and CuO in an atomic ratio of M:Ba:Cu of about 1:2:3 to obtain a powder mixture and heating and cooling the resulting mixture as described below. The starting materials are mixed well in a mixing device or by hand using a mortar and pestle to obtain an intimate powder mixture of reactants. Preferably, the starting materials are of high purity, e.g. 99.5% by weight for $BaO_2$, 99.99% by weight for CuO and 99.9 % by weight for $M_2O_3$. Less pure starting materials can be used; however, the product may then contain an amount of another phase material comparable to the amount of impurity in the starting materials. It is particularly important to avoid the presence of impurities containing iron and other transition, but non-rare earth, metals in the reactants. As used herein the phrase "consisting essentially of" or "consist essentially of" means that additional steps can be added to the process of the invention so long as such steps do not materially alter the basic and novel characteristics of the invention, e.g., the use of $BaO_2$ to obtain a single-phase superconducting product without prolonged heating or additional treatments.

The resulting mixture is then heated in an oxygen-containing atmosphere at a temperature of about 850° C. to about 925° C. for a time sufficient to form $MBa_2Cu_3O_y$, where y is from about 6.0 to about 6.4. It has been determined by TGA that when the mixture is heated to 900° C., y is from about 6.0 to about 6.4. Alternatively, the mixture can be first pressed into a disk, bar or other desired shape using conventional techniques. For heating, the mixed powder is placed in a non-reactive container such as an alumina or gold crucible. The oxygen-containing atmosphere can be air or oxygen gas, but air is preferred.

The container with the mixed powder sample is placed in a furnace and brought to a temperature of from about 850° C. to about 925° C., preferably from about 865° C. to about 900° C. It is the total time that the sample is at temperatures in this range that is important. Therefore, the minimum heating time for which the sample must be maintained at the final heating temperature depends upon the heating rate at which the sample is brought from ambient temperature to the final heating temperature. If slower heating rates are used, the minimum time for which the sample must be maintained at a final temperature of from about 850° C. to about 925° C. is shorter. If faster heating rates are used, the minimum time for which the sample must be maintained at a final temperature of from about 850° C. to about 925° C. is longer. For example, when a heating rate of 10° C. per minute is used to raise the temperature of the furnace containing the sample from ambient temperature to a final heating temperature of 900° C., ½ hour is sufficient time to maintain the sample at 900° C. to produce single-phase superconducting $MBa_2Cu_3O_x$ (total time at 850° C.-925° C. is about 35 minutes) after cooling as prescribed herein. When a heating rate of 10° C. per minute is used to raise the temperature of the furnace containing the sample from room temperature to 800° C. and a heating rate of 5° C. per minute is used to raise the temperature from 800° C. to a final heating temperature of 900° C., 12 minutes is sufficient time to maintain the sample at 900° C. to produce single-phase superconducting $MBa_2Cu_3O_x$ (total time at 850° C.-925° C. is about 22 minutes) after cooling as prescribed herein. Longer heating times can be used.

At the end of the heating period, the furnace is turned off and the resulting material is allowed to cool in the oxygen-containing atmosphere for a time sufficient to obtain the desired product. Preferably, the material is cooled to below about 100° C. (a time interval of about 6-8 hours) before the sample container is removed from the furnace. During the cooling step, the oxygen content of the material increases to give the desired $MBa_2Cu_3O_x$ product. The additional oxygen which enters the crystalline lattice of the material during this cooling step to form the desired product does so by diffusion. The rate at which oxygen enters the lattice is determined by a complex function of time, temperature, oxygen content of the atmosphere, sample form, etc. Consequently, there are numerous combinations of these conditions that will result in the desired product. For example, the rate of oxygen uptake by the material at 500° C. in air is rapid, and the desired product can be obtained in less than an hour under these conditions when the sample is in the form of a loosely packed, fine particle powder. However, if the sample is in the form of larger particles, or densely packed powders, the times required to obtain the desired product at 500° C. in air will increase.

The $MBa_2Cu_3O_x$ powder can be pressed into a desired shape, sintered in an oxygen-containing atmosphere at a temperature from about 900° C. to about 925° C., and maintained in the oxygen-containing atmosphere while cooling as prescribed above to obtain a $MBa_2Cu_3O_x$ shaped article. Well sintered, shaped articles will take longer to form the desired product while cooling than will more porous ones, and for larger, well sintered, shaped articles many hours may be required.

A convenient procedure for obtaining the desired product when the material is in the form of a powder or a small shaped object is to turn off the furnace in which the heating was conducted and to allow the material to cool in the furnace to a temperature approaching ambient (about 22° C.) which typically requires more than eight hours. In the examples, cooling in the furnace to below about 100° C. was found to be sufficient. Increasing the partial pressure of the oxygen in the atmosphere surrounding the sample during cooling increases the rate at which oxygen enters the lattice. If, in a particular experiment, the material is cooled in such a manner that the $MBa_2Cu_3O_x$ product is not obtained, the material can be heated to an intermediate temperature, such as 500° C., between ambient temperature and the final temperature used in the heating step and held at this temperature for a time sufficient to obtain the desired product. After cooling, the sample is removed from the furnace.

The resulting product is single phase and has orthorhombic symmetry as determined by X-ray diffraction measurements. The process of this invention provides a single heating-step method for preparing a superconducting $MBa_2Cu_3O_x$ composition that does not require a special atmosphere during the heating step, subsequent grinding, reheating or annealing, extended heating times or refining of the product to separate the desired superconducting $MBa_2Cu_3O_x$ composition from other phases.

The invention is further illustrated by the following examples in which temperatures are in degrees Celsius unless otherwise stated. Four-probe resistance measurements were performed on the samples in the form of sintered bars. The four-probe method is described in "Solid State Physics", Vol.6, eds. Horovitz and Johnson, Academic Press, New York, pp 36-37 (1959). A Kiethly 220 dc current source was used for applying constant current through the samples and a Kiethly 181 nanovoltmeter used to monitor the voltage drop across the samples. The chemicals (with purity indicated) used in the Examples are $BaO_2$ - (99.5%) obtained from Atomergic Chemetals Corp., CuO - (99.99%) obtained from Johnson and Matthey Chemicals Ltd. (Puratronic) or (>99%) obtained from Fluka Chemical Corp., $Y_2O_3$ - (99.99%) obtained from Research Organic/Inorganic Chemical Corp and $Eu_2O_3$ - (99.9%) and $Er_2O_3$ - (99.9%) obtained from Alfa Products. High purity chemicals were used to demonstrate that the process of the invention results in single-phase $MBa_2Cu_3O_x$. Unless stated otherwise, the mixed powder samples were heated from ambient temperature to the final heating temperature at a rate of 10° C. per minute. The temperatures and times given in the Examples are the final heating temperatures and the times for which the sample is maintained at that temperature.

EXAMPLE 1

$BaO_2$ (2.6934 g), 1.5908 g of CuO and 0.7452 g of $Y_2O_3$ were ground together in an agate mortar for 30 minutes, and the resulting mixed powder was pressed into disks, 10 cm in diameter and about 0.2 cm in thickness. The resulting disks were placed in a gold container and heated in air in a furnace for 5 hours at 900°. The furnace was then turned off and allowed to cool to a temperature below 100° after which the disks were removed. The resulting $YBa_2Cu_3O_x$ product was black. Four-probe resistance measurements performed on a product disk showed a superconducting transition at about 90 K. The disks were crushed and a X-ray powder diffraction pattern obtained. The indices of the observed reflections, the d-spacings and relative intensities are shown in Table I. The results indicate that the $YBa_2Cu_3O_x$ product has orthorhombic symmetry and no other phase was detected.

TABLE I

| X-ray diffraction data for $YBa_2Cu_3O_x$ | | |
|---|---|---|
| hkl | d(nm) | Intensity* |
| 002 | 0.5810 | vw |
| 033 | 0.3880 | m |
| 100 | 0.3805 | w |
| 012 | 0.3224 | w |
| 102 | 0.3189 | w |
| 013 | 0.2739 | s |
| 103, 110 | 0.2714 | vs |
| 111 | 0.2648 | vw |
| 112 | 0.2463 | w |
| 005 | 0.2330 | m |
| 104 | 0.2320 | vw |
| 113 | 0.2228 | m |
| 020, 006 | 0.1940 | m |
| 200 | 0.1905 | m |
| 115 | 0.1772 | w |
| 016, 023 | 0.1738 | vw |
| 106, 120 | 0.1729 | vw |
| 203, 210, 121 | 0.1713 | vw |
| 122 | 0.1669 | vvw |
| 123, 116 | 0.1582 | ms |
| 213 | 0.1568 | m |

*Legend:
s - strong
m - moderate
w - weak
v - very

EXAMPLES 2-6

$BaO_2$ (16.90 g), 11.931 g of CuO and 5.645 g of $Y_2O_3$ were ground together in an automatic grinder for 45 minutes. Portions of this mixed powder were used in Examples 2-8.

In each of Examples 2-6, approximately 1 g of the mixed powder was pressed into bars, 3 mm×3 mm×18 mm, and the resulting bars were placed in an alumina tray and heated in air in a furnace at the temperatures and for the times indicated in Table II. The furnace was then turned off and allowed to cool to a temperature below 100° after which the resulting sample was removed.

Each $YBa_2Cu_3O_x$ product was black. Four-probe resistance measurements performed on the product bars of each Example produced substantially identical results and showed a superconducting transition above 90 K. X-ray diffraction data obtained for each Example using powder from the crushed bars were, within experimental uncertainty, practically identical to that shown in Table I and no other phases were detected.

Examples 1-6 indicate that although the heating times varied from 5 hours to ½ hour and the heating temperature from 900° to 865°, there were no discernible differences in the resistance or the X-ray diffraction data and the products are practically identical.

TABLE II

| | Heating Conditions | |
|---|---|---|
| Ex. | Temperature (°) | Time (hours) |
| 2 | 900 | 3 |
| 3 | 865 | 3 |
| 4 | 900 | 2 |
| 5 | 900 | 1 |
| 6 | 900 | ½ |

EXAMPLE 7

Approximately 1 g of the same batch of mixed powder described in Examples 2-6 was pressed into bars, 3 mm×3 mm×18 mm, which were then placed in an alumina tray and heated in air in a furnace from ambient temperature to 800° at a rate of 10° per minute and from 800° to a final heating temperature of 900° at a rate of 5° per minute. The temperature was maintained at 900° for 12 minutes. The furnace was then turned off and allowed to cool to a temperature below 100° before the sample was removed.

The resulting $YBa_2Cu_3O_x$ product was black. Four-probe resistance measurements performed on a product bar showed a superconducting transition above 90 K. X-ray diffraction data obtained using powder from the crushed bars were, within experimental uncertainty, practically identical to that shown in Table I and no other phases were detected.

EXAMPLE 8

Approximately 1 g of the same batch of mixed powder described in Examples 2-6 was placed in an alumina tray and heated in air in a furnace at 900° for 2 hours. The furnace was cooled to ambient temperature and the resulting sample was removed. The resulting powder $YBa_2Cu_3O_x$ product was black and X-ray diffraction data obtained were, within experimental uncertainty, practically identical to that shown in Table I and no other phases were detected. The powder exhibited the meissner effect above 90 K, thereby indicating a superconducting transition above 90 K.

EXAMPLE 9

$BaO_2$ (1.6934), 1.1931 g of CuO and 0.8798 g of $Eu_2O_3$ were ground together in an agate mortar for 30 minutes. The resulting mixed powder was pressed into bars, 3 mm×3 mm×18 mm, which were then were placed in a alumina tray and heated in air in a furnace at 900° for 6 hours. The furnace was then turned off and allowed to cool to a temperature below 100° after which the resulting product was removed.

The resulting $EuBa_2Cu_3O_x$ product was black. Four-probe resistance measurements performed on a product bar showed a superconducting transition above 90 K. X-ray diffraction data obtained using powder from the crushed bars were similar to that shown in Table I, indicating that the product has orthorhombic symmetry and is isostructural with $YBa_2Cu_3O_x$. No other phases were detected.

EXAMPLE 10

$BaO_2$ (1.6934), 1.1931 g of CuO and 0.9563 g of $Er_2O_3$ were ground together in an agate mortar for 30 minutes. The resulting mixed powder was pressed into bars, 3 mm×3 mm×18 mm, which were then placed in a alumina tray and heated in air in a furnace at 900° for 4 hours. The furnace was then turned off and allowed to cool to a temperature below 100° after which the bars were removed.

The resulting $ErBa_2Cu_3O_x$ product was black. Four-probe resistance measurements performed on a product bar showed a superconducting transition above 90 K. X-ray diffraction data obtained using powder from the crushed bars were similar to that shown in Table I, indicating that the product has orthorhombic symmetry and is isostructural with $YBa_2Cu_3O_x$. No other phases were detected.

The invention being claimed is:

1. An improved process for preparing a superconducting composition having the formula $MBa_2Cu_3O_x$ wherein M is selected from the group consisting of Y, Nd, Sm, Eu, Gd, Dy, Ho, Er, Tm, Yb and Lu;

x is from about 6.5 to about 7.0;

said composition having a superconducting transition temperature of about 90 K;

said process consisting essentially of mixing $M_2O_3$, $BaO_2$ and CuO in an atomic ratio of M:Ba:Cu of about 1:2:3 to obtain a powder mixture; heating the resulting mixture in an oxygen-containing atmosphere at a temperature from about 850° C. to about 925° C. for a time sufficient to form $MBa_2Cu_3O_y$, where y is from about 6.0 to about 6.4; and maintaining the $MBa_2Cu_3O_y$ in an oxygen-containing atmosphere while cooling for a time sufficient to obtain the desired product, said process not requiring additional heating steps.

2. A process according to claim 1 wherein the mixture is pressed into a desired shape prior to heating.

3. A process according to claim 1 wherein the mixture is heated at a temperature from about 865° C. to about 900° C.

4. A process according to claim 2 wherein the mixture is heated at a temperature from about 865° C. to about 900° C.

5. A process according to claim 3 wherein x is from about 6.8 to about 7.0.

6. A process according to claim 4 wherein x is from about 6.8 to about 7.0.

7. A process according to claim 5 wherein the oxygen-containing atmosphere is air.

8. A process according to claim 6 wherein the oxygen-containing atmosphere is air.

9. A process according to claim 1 wherein M is Y, Eu or Er.

10. A process according to claim 2 wherein M is Y, Eu or Er.

11. A process according to claim 5 wherein M is Y, Eu or Er.

12. A process according to claim 6 wherein M is Y, Eu or Er.

13. A process according to claim 7 wherein M is Y, Eu or Er.

14. A process according to claim 8 wherein M is Y, Eu or Er.

15. A process according to claim 11 wherein M is Y.

16. A process according to claim 12 wherein M is Y.

17. A process according to claim 13 wherein M is Y.

18. A process according to claim 14 wherein M is Y.

* * * * *